(12) United States Patent
Graupner et al.

(10) Patent No.: US 7,667,354 B2
(45) Date of Patent: Feb. 23, 2010

(54) SENSOR UNIT WITH SAFETY SYSTEM

(75) Inventors: Dirk Graupner, Meerane (DE); Christian Hammer, Ebermannsdorf (DE); Werner Olbrich, Mühlheim (DE)

(73) Assignee: Siemens Aktiengesellschaft, Munich (DE)

( * ) Notice: Subject to any disclaimer, the term of this patent is extended or adjusted under 35 U.S.C. 154(b) by 122 days.

(21) Appl. No.: 11/987,475

(22) Filed: Nov. 30, 2007

(65) Prior Publication Data

US 2009/0009207 A1     Jan. 8, 2009

(30) Foreign Application Priority Data

Dec. 1, 2006    (EP) ................................ 06024959

(51) Int. Cl.
*H02J 11/00* (2006.01)

(52) U.S. Cl. ...................................... 307/326
(58) Field of Classification Search .................. 307/326
See application file for complete search history.

(56) References Cited

U.S. PATENT DOCUMENTS 5,363,303 A    11/1994  Kaneko et al.
5,513,878 A    5/1996   Ueda et al.
7,439,638 B2 *  10/2008  Lamarche et al. ........... 307/326

FOREIGN PATENT DOCUMENTS

| DE | 42 44 262 A1 | 7/1993 |
| DE | 103 45 819 A1 | 4/2005 |
| EP | 0691244 B1 | 3/2000 |
| EP | 0 968 567 B1 | 7/2001 |
| WO | WO 02 42123 A1 | 5/2002 |

* cited by examiner

*Primary Examiner*—Robert L. Deberadinis
(74) *Attorney, Agent, or Firm*—Harness, Dickey & Pierce, P.L.C.

(57) ABSTRACT

A sensor unit is disclosed with a safety system for use with a signal generator, where at least one evaluation unit is provided for evaluating a signal from a sensor and for producing a first trigger signal based on the signal. In at least one embodiment, a more compact and less expensive version of a sensor unit is provided, which operates reliably under high safety demands. In at least one embodiment, this is achieved by a safety system which has a checking unit for checking the operation of the evaluation unit using a test signal. The test signal is processed by the evaluation unit in the same way as the signal from the sensor. The two-channel output is provided on the basis of a conclusiveness check in the checking unit.

24 Claims, 2 Drawing Sheets

SENSOR UNIT WITH SAFETY SYSTEM

PRIORITY STATEMENT

The present application hereby claims priority under 35 U.S.C. §119 on European patent application number EP 06024959 filed Dec. 1, 2006, the entire contents of which is hereby incorporated herein by reference.

FIELD

Embodiments of the invention generally relate to a sensor unit, such as one with a safety system for example, which has at least one evaluation unit for evaluating a signal from a sensor and for producing a first trigger signal based on the signal. Embodiments of the invention also generally relate to a position switch with such a sensor unit.

BACKGROUND

A sensor unit and a position switch can be used in the private and in the industrial domain. Safety-oriented position switches are used to detect positions of components which move relative to one another. Possible applications are usually oriented toward avoiding or reducing risk. Such a risk might be, by way of example, a health risk or a risk to valuable production means, such as complex machines, expensive raw materials or the like. It is thus conceivable for position switches to be used in safety-oriented applications in buildings engineering, automation engineering or control engineering, for example.

Safety-oriented position switches comprise at least two components of the sensor unit, comprising a sensor, which move independently of one another, and the signal generator. The sensor unit and the signal generator cooperate on the basis of a lock-and-key principle. The sensor unit performs the lock function and the signal generator performs the function of the key, it also being possible for a plurality of signal generators to be used.

In contrast to a mechanical lock-and-key principle, new types of position switches work on a contactless basis. The component sensor unit and signal generator are therefore not mechanically connected to one another, but rather communicate by way of electromagnetic waves.

The application-related level of risk is ascertained using risk analysis. Depending on the level of risk in an application, the application is attributed what is known as a safety integrity level (SIL) based on DIN EN 61508 or a category based on DIN EN 954-1. For the design of the safety-oriented position switch, this means comprehensive measures to protect against failure of the safety-related parts.

Safety-oriented position switches which achieve SIL 3 level according to IEC 61508 or category 4 of DIN EN 954-1 use sensors to pick up redundant measurement signals and supply these signals to two different evaluation units. In this case, the evaluation units can drive a respective actuator; optionally, the two results from the evaluation units may also be logically combined with one another before the actuators are driven.

EP 0 968 567 B1 and DE 103 45 819 A1 disclose safety-oriented contactless position switches which pick up a measurement signal deemed safe, which has normally been encoded a plurality of times, on one channel and supply this measurement signal to two evaluation units. Following the redundant evaluation of the measurement signal, the consistency of the two output signals is checked and evaluated. In this context, the two evaluation units may be capable of communicating with one another during the evaluation. Depending on the result, a trigger signal is then output on two channels.

SUMMARY

In at least one embodiment, the invention specifies a contactlessly operating safety-oriented sensor unit for a position switch which satisfies high safety criteria, particularly those of safety level 3 from IEC 61508 and category 4 from EN 954-1, and can be implemented inexpensively.

In at least one embodiment, a sensor unit is used, in conjunction with the safety system having a checking unit for checking the operation of the evaluation unit using a test signal.

In at least one embodiment, the sensor unit with a safety system has an evaluation unit for evaluating a signal from a sensor, the evaluation unit being provided for producing a first trigger signal based on the signal. In line with at least one embodiment of the invention, the safety system also has a checking unit which is provided for checking the operation of the evaluation unit using a test signal. The signal handled by the evaluation unit and the test signal from the checking unit, which signal is likewise handled by the evaluation unit, are processed in the same way on the evaluation unit, so that the result supplied can be checked. By way of example, the check can be performed by comparing the second trigger signal generated by the checking unit with the first trigger signal. The method allows the necessary safety level 3 and the category 4 from the aforementioned standards to be achieved, and particularly also higher safety levels (SIL) from IEC 61508.

Advantageously, the checking unit is provided for producing a second trigger signal, particularly a signal or code that is diversified from the first trigger signal, so that a decision can be made on the basis of at least two statements. The two trigger signals may serve a respective output, so that the output from the sensor unit may be on two channels, for example. If appropriate, the first and second trigger signals can be logically combined in a combinational logic unit, such as an AND function. An output in single-channel or two-channel form is then dependent on the output from the combinational logic unit and the safety integrity level to be achieved.

Advantageously, the combinational logic unit may at least partly perform a conclusiveness check on the second trigger signal, the second trigger signal being rated in comparison with the first trigger signal on the basis of a test trigger signal.

Advantageously, the evaluation unit is provided by way of an input for supplying the test signal, with a single input for the test signal and the signal from the sensor being able to be used to achieve a higher SIL than when there are two separate inputs.

Advantageously, the evaluation unit is provided for producing the operation statement based on the test signal, for example in the form of a test trigger signal, this operation statement being made available to the checking unit, for example, via a separate output of the evaluation unit.

Advantageously, the sensor unit, particularly the checking unit, has a generation unit which is provided for logically combining, combining, encoding and/or scrambling the signal from the sensor. As a result, the signal is simultaneously used to generate the test signal. It is likewise conceivable for the test signal to be generated independently of the signal from the sensor. The two methods of test signal generation mentioned can be chosen on the basis of the application, particularly on the basis of the signal type. In this connection, it is important for the test signal to be able to verify the operation of the evaluation unit explicitly.

Advantageously, the checking unit is provided for checking conclusiveness by, in the simplest case, comparing the first trigger signal from the evaluation unit with the test trigger signal. If the test signal has been scrambled or logically combined or combined with the signal from the sensor, the conclusiveness check is preceded by the test trigger signal being descrambled or the logic combination or combination which is known to the checking unit being derived by calculation. The conclusiveness check can at least in part likewise be performed by a combinational logic unit which works independently of the checking unit.

Advantageously, the checking unit is provided for checking the operation or conclusiveness of the evaluation unit a plurality of times. In this context, the checking unit checks control parameters for the evaluation unit, such as key values or interim results, on the basis of particular program steps. Conversely, it makes sense to provide the evaluation unit for checking the operation and/or conclusiveness of the checking unit once or a plurality of times. The checking unit likewise has a checking scheme which can be executed in the form of an algorithm. During program execution, markers, known as steps, are reached which allow proper operation of the checking unit to be rated by the evaluation unit. Consequently, reciprocal, possibly step-by-step, control between the evaluation unit and the checking unit is possible.

Advantageously, the evaluation unit and/or the checking unit are provided for controlling at least one actuator. The two-channel output is therefore made directly to two separate actuators, for example. Alternatively, the two results from the evaluation unit and from the checking unit may also be logically combined with one another in the combinational logic unit before the actuators are driven.

Advantageously, the sensor unit can be operated with just one sensor. Since every conceivable error in a signal generator leads to what is known as the safe state, it is merely necessary to ensure correct operation of the evaluation unit regardless of the number of sensors. The necessary check on the evaluation unit by the checking unit is implemented inexpensively, not least by virtue of just one sensor element and just one checking unit already being sufficient to check the operation of the evaluation unit.

Further advantageous refinements and preferred developments of embodiments of the invention can be found in the description of the figures and/or in the subclaims.

BRIEF DESCRIPTION OF THE DRAWINGS

The invention is described and explained in more detail below using the example embodiments illustrated in the figures, in which.

DETAILED DESCRIPTION OF THE EXAMPLE EMBODIMENTS

Figure 1:
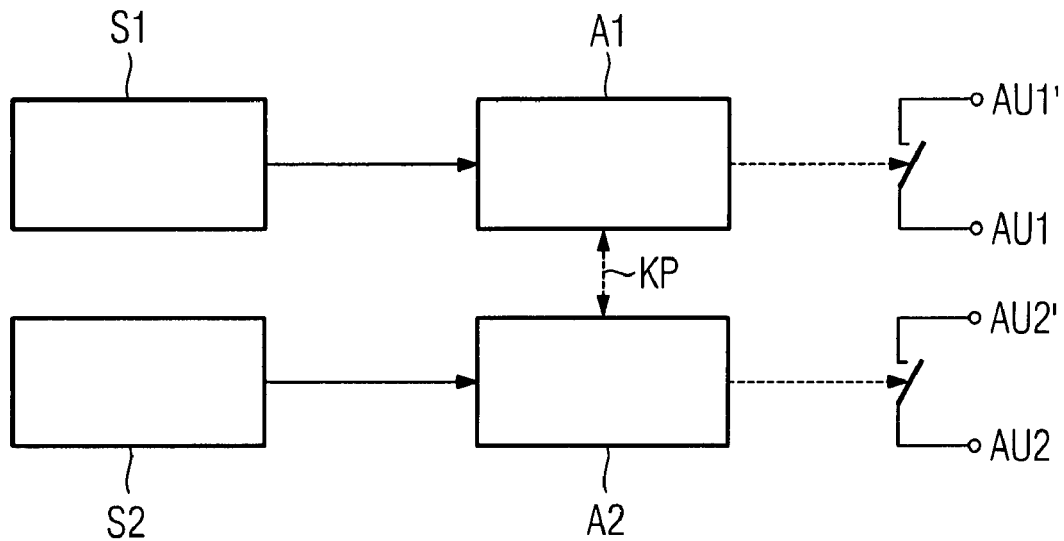
FIG. 1 shows a schematic depiction of a sensor unit in a transponder-based position switch from the prior art.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

FIG. 1 shows a schematic depiction of a sensor unit in a transponder-based position switch from the prior art.

The sensor unit shown is based on redundant sensor evaluation units. Two sensors S1, S2 and two evaluation units A1, A2 are used, with the evaluation units A1, A2 controlling one another and respectively emitting a trigger signal if the two evaluations accordantly produce the result that a trigger situation is present. If the evaluations by the evaluation units A1, A2 do not match, only one trigger signal is sent, which may then not be sufficient to initiate a safety-related measure.

Figure 2:
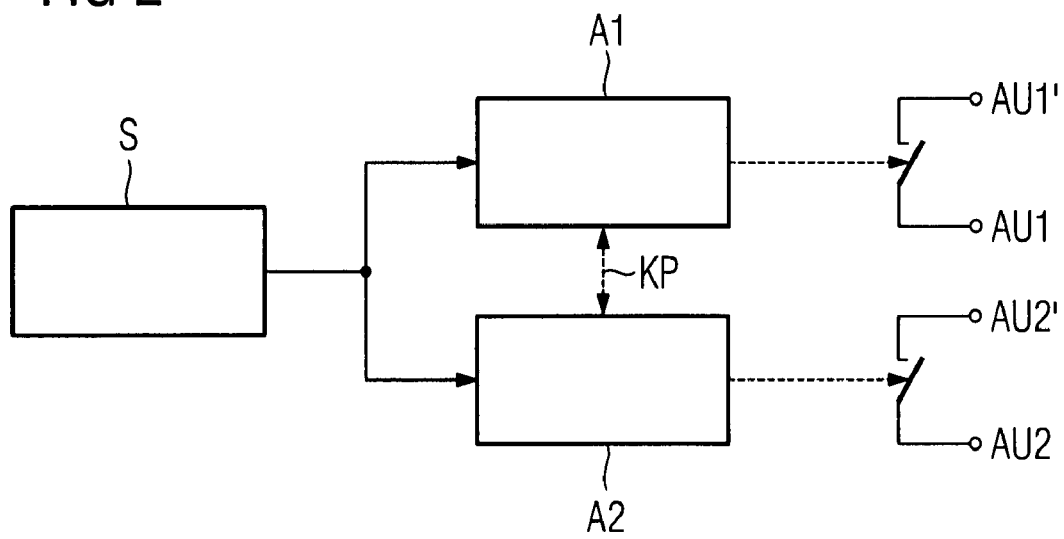
FIG. 2 shows a schematic depiction of a sensor unit in a transponder-based position switch with a single measurement sensor, from the prior art.

FIG. 2 shows a schematic depiction of a sensor unit in a transponder-based position switch with a single measurement sensor, from the prior art.

The two evaluation units A1, A2 cooperate with a sensor S. This saves a sensor, with failure of the sensor S being able to be recognized from the absence of the trigger signals.

Figure 3:
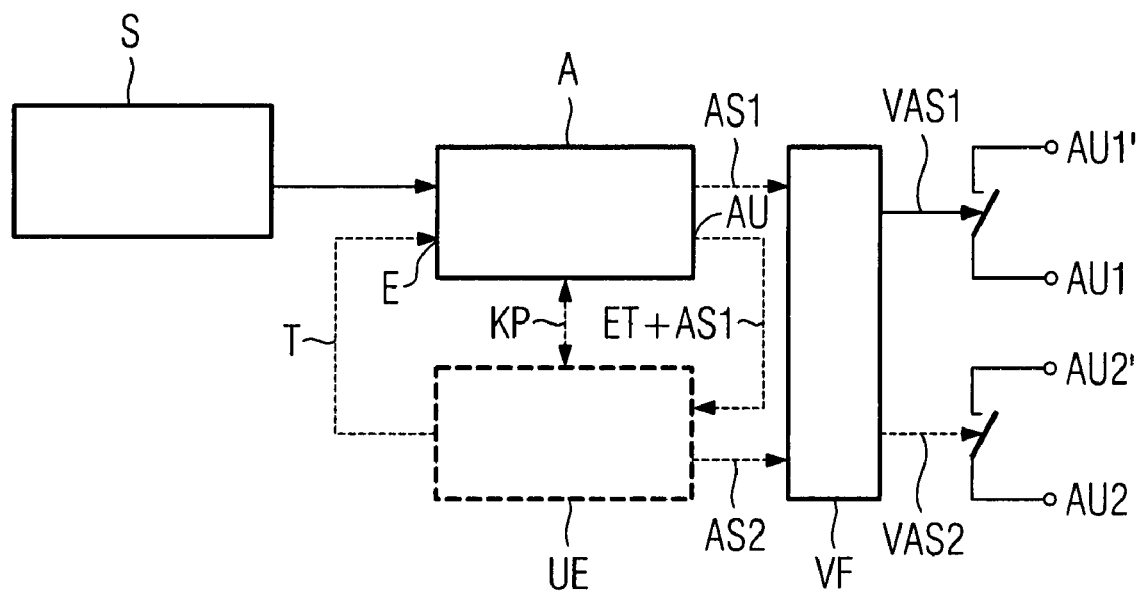
FIG. 3 shows a schematic depiction of a sensor unit with a checking unit.

FIG. 3 shows a schematic depiction of a sensor unit with a checking unit UE.

A signal generator (not shown) communicates electromagnetically with the measurement sensor, called sensor S for short, in the sensor unit. The measurement signal from the sensor S (also: signal from the sensor S) is supplied to an evaluation unit A. Likewise, the input E supplies the test signal T from the checking unit UE. The signal S and the test signal T are evaluated by the evaluation unit A in the same manner. During the program execution for the signal handling or signal recognition, control parameters (KP) from intermediate steps, such as interim results, in the checking unit UE can be checked by the evaluation unit A and vice versa.

The evaluation unit A forwards a first trigger signal AS1 to the combinational logic unit VF and uses the output AU to transmit a test trigger signal ET to the checking unit UE. The checking unit UE performs a conclusiveness test, which may likewise be based on the first trigger signal AS1. In this case, the conclusiveness test may be based on different functions and/or checks. By way of example, variables which include the length of the signals, their overlap, their intensity, their contrast or their modulation. In addition, a content comparison is conceivable, particularly may be relevant in the case of digital signals. In this context, mathematical functions and logic combinations, in particular, may be used directly or indirectly to ascertain an error rate. Other similar forms of conclusiveness check are likewise conceivable.

Following the conclusiveness check, an output of the checking unit EU provides a second trigger signal AS2, which is forwarded to the combinational logic unit VF like the first trigger signal AS1.

The combinational logic unit VF may produce a single-channel or multi-channel output, since the logically combined trigger signals VAS1, VAS2 are based on a two-channel input into the combinational logic unit VF. In this example embodiment, the generation of a first logically combined output signal AS1 results in contact connection being triggered for the outputs AU1' and AU1. In the same way, a second logically combined trigger signal VAS2 is used to contact-connect the outputs AU2', AU2. An AND function is also possible, which means that both trigger signals AS1, AS2 need to be present in order to trigger the contact connection for the outputs AU1' and AU1 and for the outputs AU2' and AU2.

Thus, the combinational logic unit VF becomes part of the safety check, because output of one of the two logically combined trigger signals VAS1, VAS2 is possible only if both input signals, that is to say the first trigger signal AS1 and the second trigger signal AS2, are actually also present.

Advantageously, the first and second trigger signals AS1, AS2 can be used directly to control the contact connection for the outputs AU1', AU1, AU2', AU2.

Advantageously, a generation unit for the test signal is integrated into the checking unit UE.

In addition, it is advantageous if the checking unit UE likewise uses the control parameters KP to perform a comprehensive conclusiveness check in combination with the test trigger signal ET.

Figure 4:
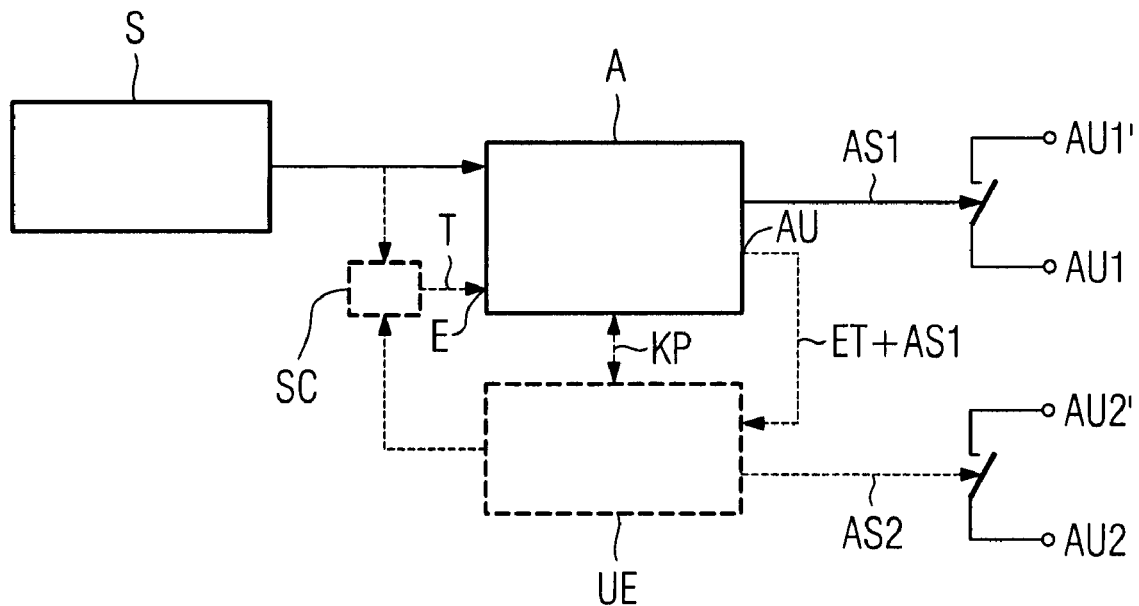
FIG. 4 shows a schematic depiction of a sensor unit with a checking unit and measurement-signal-based test signal generation.

FIG. 4 shows a schematic depiction of a sensor unit in a transponder-based position switch, the sensor unit involving test signal generation based on a measurement signal. In similar fashion to the sensor unit from FIG. 3, the sensor unit in FIG. 4 has a sensor S which forwards a signal to an evaluation unit A. The test signal T, which the evaluation unit A handles in the same manner as the signal from the sensor S, is produced in the checking unit UE. The mixing for a signal with multiple encoding, for example, is implemented in the scrambler SC. The modes of operation of the checking unit UE are otherwise in line with the checking unit UE which is known from FIG. 3.

Advantageously, the output AU of the evaluation unit A outputs not only the test trigger signal ET but also the first trigger signal AS1 from the evaluation unit A. This makes the conclusiveness check in the checking unit UE simpler, since the two relevant signals are transmitted using the same channel.

The use of a combinational logic unit VF instead of directly driving the actuators which are connected to the outputs AU1', AU1 and AU2', AU2 is also possible in this example embodiment.

In summary, at least one embodiment of the invention relates to a sensor unit with a safety system for use with a signal generator, where at least one evaluation unit is provided for evaluating a signal from a sensor and for producing a first trigger signal based on the signal. The aim is to specify a more compact and less expensive version of a sensor unit which operates reliably under high safety demands. This is achieved by a safety system which has a checking unit for checking the operation of the evaluation unit using a test signal. The test signal is processed by the evaluation unit in the same way as the signal from the measurement sensor. A two-channel output is provided on the basis of a conclusiveness check in the checking unit.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A sensor unit, comprising:
    a safety system, including
        at least one evaluation unit to evaluate a signal from at least one sensor and to produce a first trigger signal based on the signal,
        a checking unit to check operation of the at least one evaluation unit using a test signal, and
        a scrambler to encrypt the signal from the at least one sensor using the test signal.

2. The sensor unit as claimed in claim 1, where the checking unit is useable to produce a second trigger signal.

3. The sensor unit as claimed in claim 2, wherein the evaluation unit is useable to produce a test trigger signal based on the test signal.

4. The sensor unit as claimed in claim 1, wherein the at least one evaluation unit is useable to produce a test trigger signal based on the test signal.

5. The sensor unit as claimed in claim 1, wherein the at least one evaluation unit includes a first input for the signal from the at least one sensor and a second input for the test signal.

6. The sensor unit as claimed in claim 1, wherein at least one of
    the first and second inputs are identical, and
    the first and second inputs together form one input.

7. The sensor unit as claimed in claim 1, wherein the at least one evaluation unit includes a first output and a second output.

8. The sensor unit as claimed in claim 1, wherein the second trigger signal is based on a conclusiveness check on the test trigger signal.

9. The sensor unit as claimed in claim 8, wherein the second trigger signal is based on a conclusiveness check on the test trigger signal in comparison with at least one of the first trigger signal and the test signal.

10. The sensor unit as claimed in claim 1, wherein the scrambler is provided for at least one of logically combining, combining, encoding and scrambling the signal from the sensor.

11. The sensor unit as claimed in claim 1, wherein the checking unit is useable to check operation of the at least one evaluation unit a plurality of times using at least one of a plurality of test signals and one or more control parameters.

12. The sensor unit as claimed in claim 11, wherein the check on the operation of the checking unit is provided after at least one intermediate step in a processing process.

13. The sensor unit as claimed in claim 1, wherein the at least one evaluation unit is useable to check the operation of the checking unit once or a plurality of times using one or more control parameters.

14. The sensor unit as claimed in claim 13, wherein the check on the operation of the at least one evaluation unit is provided after at least one intermediate step in a processing process.

15. The sensor unit as claimed in claim 1, wherein the sensor unit includes a combinational logic unit provided to logically combine the first and the second trigger signal to form at least one logically combined trigger signal.

16. The sensor unit as claimed in claim 15, wherein at least one of the first trigger signal, the second trigger signal and the logically combined trigger signal is respectively provided for controlling at least one actuator.

17. The sensor unit as claimed in claim 1, wherein the sensor in the sensor unit is further provided for contactless reception of data from a signal generator.

18. The sensor unit as claimed in claim 1, wherein the first input and the second input are provided with signals for supply to the at least one evaluation unit, the signals being at least one of diversified from one another and encoded.

19. The sensor unit as claimed in claim 1, wherein at least one of the signal from the sensor and the test signal are provided for encoding once or a plurality of times.

20. A position switch, comprising:
a sensor unit as claimed in claim 1; and
at least one signal generator configured to communicate with the sensor unit.

21. A sensor unit, comprising:
at least one evaluation unit to evaluate a signal from at least one sensor and to produce a first trigger signal based on the signal;
a checking unit to check operation of the at least one evaluation unit using a test signal; and
a scrambler to encrypt the signal from the at least one sensor using the test signal.

22. A position switch, comprising:
a sensor unit as claimed in claim 21; and
at least one signal generator configured to communicate with the sensor unit.

23. A sensor unit, comprising:
means for evaluating a signal from at least one sensor and to produce a first trigger signal based on the signal;
means for checking operation of the means for evaluating using a test signal; and
means for encrypting the signal from the means for checking using the test signal.

24. A position switch, comprising:
a sensor unit as claimed in claim 23; and
at least one signal generator configured to communicate with the sensor unit.

* * * * *